METHOD OF DELINEATING A SELECTED REGION ON A SURFACE

Original Filed March 1, 1968

United States Patent Office
3,681,103
Patented Aug. 1, 1972

3,681,103
METHOD OF DELINEATING A SELECTED REGION ON A SURFACE

Martin J. Brown, Lambertville, N.J., assignor to Western Electric Company, Incorporated, New York, N.Y.

Original application Mar. 1, 1968, Ser. No. 709,672, now Patent No. 3,544,790. Divided and this application Oct. 16, 1970, Ser. No. 81,583
Int. Cl. B44d *1/02, 1/50;* C23b *7/00*
U.S. Cl. 117—8.5 3 Claims

ABSTRACT OF THE DISCLOSURE

An improved mask provides increased resolution of a substrate pattern delineated by electron beam radiation-induced polymerization over selected portions of a coating on the substrate. A peripheral lip extending from the bottom of the mask penetrates the coating and contacts the substrate to prevent electrons scattered from the substrate portions adjacent the mask from penetrating and curing the coating portion below the mask. The remainder of the scattered energy is dissipated in an internal cavity defined by the inner surface of the lip and the bottom of the mask.

This application is a division of application Ser. No. 709,672, filed Mar. 1, 1968, now Pat. No. 3,544,790.

BACKGROUND OF THE INVENTION

(A) Prior art

In recent years electron beam techniques have been devised which are capable of defining substrate patterns having greater mechanical toughness and resistance to corrosive chemicals (such as those employed in electroplating) than patterns defined with the older and better known photoresist techniques. In the newer arrangement, a thin coating of an electron beam-curable resin is placed on the surface of the substrate, and a mask opaque to such radiation is placed in the path of the beam and over the substrate portion to be delineated. The substrate is then irradiated with an electron beam to cure the exposed portion of the resin, and the uncured portions are later removed with a suitable solvent to expose the underlying areas of the substrate.

Theoretically, the bombardment of the masked substrate by a high energy electron beam will cure the resin only in those areas which are not overlaid with the mask. In such a case the use of a mask having a sharply bounded periphery should result in a correspondingly well defined interface between the cured and uncured portions of the coating.

In practice, however, it is found that where sharply bounded patterns such as squares are to be defined the interface between the cured and uncured portions of the coating following the irradiation step is often blurred. In particular it appears that curing takes place below the mask over a significant region extending inwardly from the mask periphery. As a result, the resolution of the patterns on the substrate exposed when the uncured portions of the coating are removed is often intolerably low.

(B) Discussion of problem

Investigation of the problem of the blurred delineation led to the discovery that the undesired radiation curing under the mask results primarily from electrons scattered from the unmasked portions of the substrate adjacent the mask during the irradiation step. In particular, it was discovered that a portion of the scattered electrons propagate through the coating between the bottom surface of the mask and the underlying portions of the substrate.

During such propagation beneath the mask, the electrons undergo further multiple reflections and scattering between the mask and the substrate. This action cures the affected portions of the coating until the electron energy intensity (which diminishes with distance along the propagation path) is no longer sufficient to effect a cure.

SUMMARY OF THE INVENTION

In accordance with the invention an improved beam mask has been devised to alleviate this problem. In an illustrative embodiment, a generally planar, pattern-defining portion (hereafter "plate portion") of the mask is held in spaced relation to the coating by an atomically dense pheripheral flange that depends from the lower surface of the plate portion. The flange terminates in a knife-edge at its lower end for penetrating the coating and contacting the substrate without significantly disrupting the coating. The flange provides an effective shutter which prevents a large portion of the scattered electrons from the adjacent portion of the substrate from entering the coating region below the mask. Moreover, the relatively small portion of electrons that do penetrate the flange is effectively trapped within the cavity formed by the inner wall of the flange and the lower surface of the plate portion. As a result, the energy of the electrons is diminished rapidly below the level necessary to effect a cure over any significant coating portion beneath the mask.

BRIEF DESCRIPTION OF THE DRAWING

The nature of the invention and its advantages will appear more fully from the following detailed description taken in conjunction with the appended drawing, in which.

DETAILED DESCRIPTION

Figure 1:
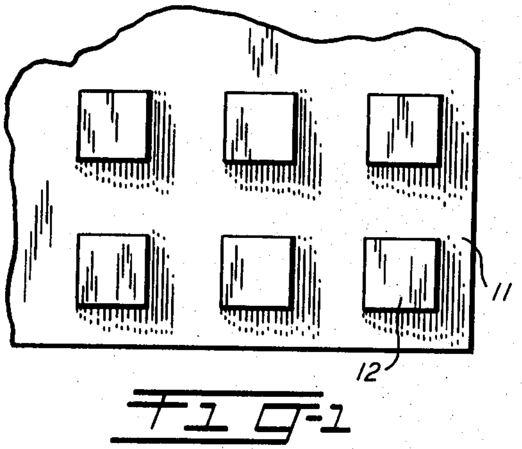
FIG. 1 is a top view of a substrate which is delineated with a pattern of square regions.

Referring now in more detail to the drawing, FIG. 1 illustrates a substrate 11, illustratively of steel, which is to be delineated with a pattern of square areas 12—12. Such a pattern may be employed, for example, for receiving a plating of a suitable metal such as copper or a magnetic material (e.g., vicalloy).

The required square pattern on the substrate 11 may be established in the manner described below by high intensity electron irradiation from a conventional normally deactivated source 13 (FIG. 2), which is assumed to be located above the substrate in open air or, alternatively, in a controlled atmosphere exhibiting at most a partial vacuum. The source 13, which may be of the type described e.g., in U.S. Pat. 2,906,679 (1959), emits radiation in the form of an electron beam depicted schematically at 14 when the source is activated. The substrate 11 is affixed to a suitable base 16 so that a face 17 of the substrate to be exposed to the beam 14 is transverse to the direction of the beam and disposed a distance A from the source 13.

Figure 3:
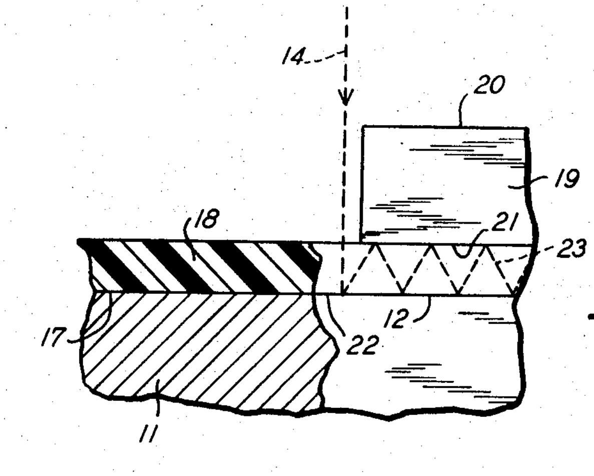
PRIOR ART FIG-3
FIG. 3 is an enlarged elevational view of a portion of the prior art arrangement of FIG. 2, illustrating diagrammatically the penetration of scattered electrons beneath the mask.

As best shown in FIG. 3, the face 17 is coated with a layer 18 of a resin or other composition normally soluble in an organic solvent but rendered relatively insoluble in such solvent upon exposure to a sufficient dosage of radiation by high energy electrons. Illustratively the layer 18 may be formed from a partially polymerized polyester resin (such as the styrene resin supplied under the designation "Selectron 5003" by the Pittsburgh Plate Glass Company) which becomes more completely polymerized (or "cured") to form an insoluble gel when subjected to a radiation dosage in the range of 5–10 megarads. The latter may be hereafter referred to as the "curing dosage."

Prior art masking arrangement

After the coating 18 is laid over the face 17 of the substrate, a plurality of identical, irradiation-resistant planar masks 19—19 (FIG. 2) of atomically dense material such as steel are placed directly on top of the coating 18 (FIG. 3) above the areas 12 of the substrate to be delineated. The term "atomically dense" as used herein designates a material of high atomic number (e.g. 26 or more) which resists substantial penetration by electron bombardment. Each mask 19 is assumed to have a well defined cross section coextensive with the associated area 12 on the substrate. A thickness B (FIG. 2) of the mask 19 between a top surface 20 (which is exposed to the beam 14) and a bottom surface 21 (which is in contact with the coating 18 in FIG. 3) is made sufficient to attenuate beam energy of curing dosage incident on the mask before such energy can reach the underying coating.

Once the coated substrate has been masked the source 13 (FIG. 2) may be activated and the substrate 11 irradiated with electron beam energy of curing dosage to cure the unmasked portions of the coating 18 (FIG. 3). While not shown explicitly in the drawing, excessive heating of the masks and substrate during the irradiation step may be prevented by scanning the electron beam over the masked substrate or, alternatively, by directing a stream of pressurized air or the like against the masked substrate.

Following the irradiation step, the masks 19 are removed and the coated substrate is contacted by an organic solvent (not shown), preferably a monomer of the uncured coating material or other chemically similar substance to dissolve the uncured portions of the coating and expose the underlying substrate. The cured portions of the coating remain on the substrate and theoretically define and bound the pattern of square substrate areas 12 which may then be plated or otherwise treated in any suitable manner.

With the masking arrangement depicted in FIG. 3, it is found that the definition of the boundaries of the exposed portions of the substrate is much poorer than that obtained using photoresist techniques when accurate square patterns, such as those deviating not more than 5% on a side from the required configuration, must be formed on the substrate.

It appears that the probable cause of the poor definition under these circumstances is as follows:

During the irradiation step a portion of the electrons in the beam 14 strike a region 22 of the substrate adjacent the mask 19 and are scattered therefrom. The scattered electrons penetrate the portion of the coating 18 below the adjacent periphery of the mask. These electrons may illustratively propagate in a zig-zag path 23 through the coating 18 under the mask, resulting in multiple reflections between the lower mask surface 21 and the coated surface 17 of the substrate. While the energy of the electrons eventually diminishes with increasing penetration into the mask to a level below the curing dosage, this energy may nevertheless remain high enough during the propagation to cure the coating traversed by the path over a considerable portion of the substrate under the mask. Hence the periphery of the substrate regions exposed by later dissolving the uncured coating portions will not coincide with the sharp boundaries of the regions defined by the face of the mask. In the case of the square patterns mentioned above, it was found that the patterns delineated by the technique of FIG. 3 were out of tolerance by 100 percent or more.

Improved masking arrangement

Figure 2:
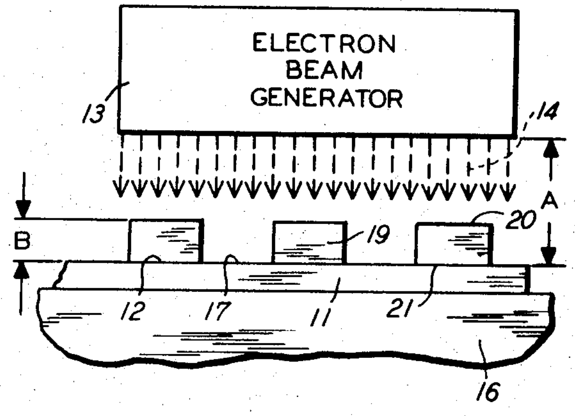
FIG. 2 is an elevational view, partially in diagrammatic form, illustrating an electron beam radiation technique for delineating the square regions of FIG. 1 with the aid of a prior art masking arrangement.

In accordance with the invention the resolution obtained when delineating such minute patterns on a substrate by electron beam irradiation may be greatly improved by utilizing a composite mask 24 (FIG. 4) in place of the prior art mask 19 of FIGS. 2–3. Illustratively the mask 24 (FIG. 4) includes a planar, radiation-resistant plate portion 26 which may be identical in construction, shape and thickness to the entire mask 19 of FIG. 2. Additionally, however, the mask 24 (FIG. 4) includes a hollow elongated flange 27 extending downwardly from the periphery of a bottom surface 28 of the plate portion 26. The flange 27 terminates at its lower end in a region 29 of reduced cross section, preferably knife-edge. The flange 27 is formed from an atomically dense material similar to that of the plate portion 26. An inner wall surface 31 of the flange 27 forms a cavity 32 with the overlying bottom surface 28 of the plate portion 26. The bottom surface 28 may be coated or otherwise provided with a layer 33 of a suitable polymer, such as Teflon, having a low atomic number (e.g. less than 13). for minimizing electron backscatter. A height S of the cavity 32 between the knife-edge 29 and the bottom surface 28 of the plate portion 26 is made greater than the thickness of the coating 18.

Figure 4:
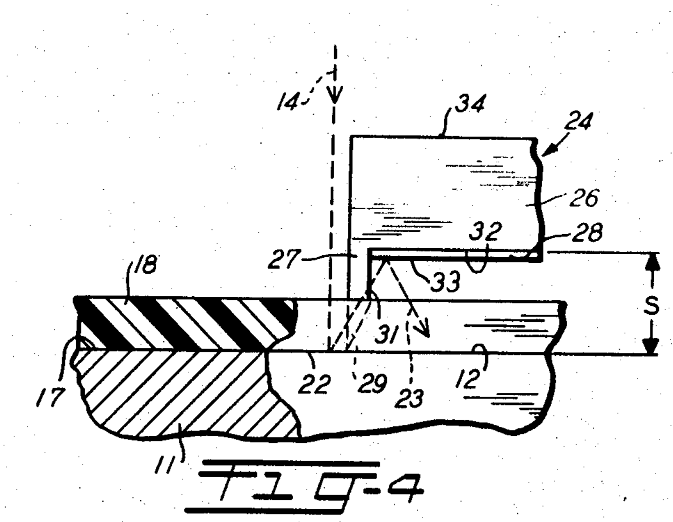
FIG. 4 is an enlarged elevational view similar to FIG. 3 and depicting a mask constructed in accordance with the invention for effecting a marked reduction in penetration of the scattered electrons below the mask.

The employment of the mask 24 of FIG. 4 in the electron beam irradiation process described above in connection with FIGS. 2–3 will now be illustrated. Like elements in FIGS. 2–4 have been given like reference numerals. The source 13 is again assumed to be initially deactivated. After the coating 18 is spread over the face 17 of the substrate, the mask 24 is placed, flanged down, on the portion of the coating overlying the associated area 12 of the substrate to be delineated. In this position the knife-edge 29 of the flange 27 is an engagement wth the coating 18 and supports the plate portion 26 in a position parallel to the substrate and perpendicular to the direction of the beam 14.

Sufficient downward pressure is then applied to the mask 24 so that the knife-edge 29 completely penetrates the coating 18, without significantly disturbing it, and contacts the underlying surface 17 of the substrate. In this position the mask 24 forms an atomically dense shutter which encloses an overall volume of space that is bounded transversely by the square substrate region 12 to be delineated and which extends upwardly from the substrate surface 17 to a top surface 34 of the plate portion 26.

When the substrate is subsequently irradiated by activating the source 13 (FIG. 2), the atomically dense flange 27 (FIG. 4) is interposed in the oblique propagation path 23 of the electrons scattered from the substrate region 22 adjacent the mask 24. As a result, electron penetration into the coating 18 below the mask is substantially prevented. Moreover, the electron energy that does penetrate the knife-edge 29 is trapped in the interior of the cavity 32. In particular, the electrons entering the cavity proceed upwardly along the path 23 for a distance far beyond the coating to reach the bottom surface 28 of the plate portion 26. Further scattering of electrons from the surface 28 is significantly inhibited by the polymer layer 33. The scattered electrons that do leave the surface 28 travel downwardly along the path 23 for a relatively great distance to penetrate the coating 18 again. The net effect of these cumulative barriers to electron penetration provided by the mask 24 is to assure that the electron intensity in the cavity will be diminished below the curing level before significant curing under the mask can take place. As a result, substantially the entire region of the coating 18 below the sharply defined square periphery of the plate portion 26 will remain uncured. The desired square areas 12 of the substrate may thus be delineated very accurately when the uncured portions of the coating are later removed.

It will be understood that a plurality of patterns, such as the regions 12 in FIG. 1, may be delineated simultaneously by a network of the masks 24 (FIG. 4) that are held in proper relationship by suitable means (not shown). Such means may include, e.g., a thin web transparent to the incident radiation, or a light wire frame constructed to cast a minimum shadow. Alternatively, the masks 24 may be individually set in place over the areas 12 (FIG. 1) using a suitable alignment member.

Without in any way limiting the generality of the foregoing, an example of the use of the mask 24 in the electron beam irradiation process will now be described.

EXAMPLE

The prototype workpiece was a steel substrate which was to be prepared for ultimately receiving an electroformed pattern of copper plate. The pattern took the form of a linear array of three square regions .035 inch on a side and spaced .130 inch center to center.

A viscous coating of polyester resin approximately 0.10 inch thick was spread over the steel substrate. Each substrate region to be delineated was overlaid by a steel mask having (1) a square plate portion .035 inch on a side and (2) a depending steel lip which extended approximately .125 inch below the bottom surface of the plate portion and terminated in a knife-edge about .001 inch thick. The source of beam radiation was mounted about 3 inches above the substrate.

Irradiation of the substrate took place for 30 seconds at a peak beam energy of about 1 mev. and an average beam current of 0.9 ma. to cure the unmasked portions of the substrate. When the masks were removed, the substrate was dipped into a bath of hot monomeric styrene to remove the uncured portions of the coating and expose the underlying substrate.

Inspection of the resulting delineated square pattern showed extremely high resolution with each delineated portion deviating no more than .002 inch on a side from the required square configuration. It will be appreciated that such resolution approaches that obtainable with photo-resist techniques.

It will be further understood that the above described form of electron beam mask and the process of employing it are merely illustrative of the principles of the invention. Many other variations and modifications will now occur to those skilled in the art. For example, nonconductive substrates (such as glass), and other types of electron beam-curable coatings (such as silicone grease and polydimethylsiloxane) may be employed.

Moreover, the height S of the flange in the mask is not overly critical and may be determined empirically to obtain the optimum pattern resolution. These and many other such variations may be made without departing from the spirit and scope of the invention.

What is claimed is:

1. In a method of delineating a selected region on a surface, the steps of:

applying to the surface a coating of an uncured resin that is curable upon exposure to electron beam irradiation;

enclosing, with atomically dense material, a volume of space bounded laterally by the selected region and extending upwardly through the coating from the underlying surface for a predetermined distance above the coating; and subjecting the surface to electron beam irradiation to cure only the nonenclosed portion of the coating.

2. A method as defined in claim 1, further comprising the steps of removing the enclosing material and dissolving the previously enclosed uncured portion of the coating to expose the underlying selected region of the surface.

3. In a method of delineating a selected region on one face of a substrate, the steps of:

applying to the one face a coating of an uncured resin that is curable upon exposure to electron beam irradiation;

positioning, on the portion of the coating overlying the selected region, a mask having a depending hollow flange in the configuration of the selected region;

urging the mask downwardly against the coating so that the bottom of the flange penetrates the last-mentioned coating portion and contacts the underlying substrate; and subjecting the one face of the substrate to electron beam irradiation to cure the remaining portions of the coating.

References Cited

UNITED STATES PATENTS

| | | | |
|---|---|---|---|
| 2,363,844 | 11/1944 | Duggan | 188—505 |
| 2,783,164 | 2/1957 | Hill | 118—504 X |
| 3,113,896 | 12/1963 | Mann | 156—3 |
| 3,144,366 | 8/1964 | Rideout et al. | 148—187 X |
| 3,226,255 | 12/1965 | Cieniewicz et al. | 118—504 X |
| 3,272,670 | 9/1966 | Myers | 156—13 |
| 3,497,570 | 2/1970 | Yerrick | 204—159.13 X |
| 3,573,975 | 4/1971 | Dhaka et al. | 117—5.5 X |
| 3,607,382 | 9/1971 | Henker | 117—8.5 X |

ALFRED L. LEAVITT, Primary Examiner

T. E. BOKAN, Assistant Examiner

U.S. Cl. X.R.

117—5.5, 10, 63, 93.31; 156—13, 16; 204—15, 159.13, 159.19